United States Patent
Chien et al.

(10) Patent No.: US 9,502,476 B2
(45) Date of Patent: Nov. 22, 2016

(54) STRUCTURE OF PIXEL

(71) Applicant: HON HAI PRECISION INDUSTRY CO., LTD., New Taipei (TW)

(72) Inventors: Liang-Neng Chien, New Taipei (TW); Chun-Chieh Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/718,912

(22) Filed: May 21, 2015

(65) Prior Publication Data
US 2016/0284769 A1 Sep. 29, 2016

(30) Foreign Application Priority Data
Mar. 25, 2015 (TW) .............................. 104109456 A

(51) Int. Cl.
*H01L 29/20* (2006.01)
*H01L 27/32* (2006.01)

(52) U.S. Cl.
CPC ....... *H01L 27/3218* (2013.01); *H01L 27/3216* (2013.01)

(58) Field of Classification Search
CPC .............. H01L 27/3218; H01L 27/316; H01L 27/124; H01L 27/3244; H01L 27/3213; H01L 27/322; H01L 27/318; H01L 1/134363; H01L 27/1464; H01L 27/3246; G01F 1/133514
See application file for complete search history.

(56) References Cited

U.S. PATENT DOCUMENTS

| | | | | |
|---|---|---|---|---|
| 6,829,008 B1* | 12/2004 | Kondo | ..................... | G02B 7/34 348/302 |
| 8,878,970 B2* | 11/2014 | Tanaka | ................... | H04N 9/045 348/222.1 |
| 9,287,333 B2* | 3/2016 | Jinta | .................... | H01L 27/3218 |
| 2010/0020209 A1* | 1/2010 | Kim | ....................... | H04N 3/155 348/294 |
| 2010/0117126 A1* | 5/2010 | Takahashi | ......... | H01L 27/14609 257/292 |
| 2012/0193515 A1* | 8/2012 | Agranov | ................. | G01S 3/782 250/208.1 |
| 2013/0140663 A1* | 6/2013 | Fukuda | .................. | G03B 13/36 257/432 |
| 2013/0286261 A1* | 10/2013 | Tanaka | ................. | H04N 5/3728 348/280 |
| 2014/0197385 A1* | 7/2014 | Madigan | ................ | H01L 51/56 257/40 |
| 2015/0109492 A1* | 4/2015 | Hayashi | ................ | H04N 9/045 348/277 |
| 2015/0349033 A1* | 12/2015 | Shen | ................... | H01L 27/3213 257/89 |

* cited by examiner

Primary Examiner — Yosef Gebreyesus
(74) Attorney, Agent, or Firm — Zhigang Ma

(57) ABSTRACT

A pixel structure in an organic light emitting display panel includes a plurality of pixels. Each pixel includes a first sub-pixel, a second sub-pixel, and a third sub-pixel. Lengths of the first sub-pixel, the second sub-pixel, and the third sub-pixel are arranged along a first direction. Widths of the first sub-pixel, the second sub-pixel, and the third sub-pixel is arranged along a second direction. A length of the first sub-pixel is greater than a length of the second sub-pixel along the first direction and a length of the third sub-pixel along the first direction. The first sub-pixel, the second sub-pixel, and the third sub-pixel are orderly arranged along the second direction.

16 Claims, 7 Drawing Sheets

STRUCTURE OF PIXEL

CROSS-REFERENCE TO RELATED APPLICATIONS

This application claims priority to Taiwanese Patent Application No. 104109456 filed on Mar. 25, 2015, the contents of which are incorporated by reference herein.

FIELD

The subject matter herein generally relates to a structure of pixel.

BACKGROUND

As shown in FIG. 1, an organic light emitting display (OLED) includes a pixel structure 100 with a plurality of pixels 10. Each pixel 10 includes a red sub-pixel 11, a green sub-pixel 13, and a blue sub-pixel 15. The red sub-pixel 11, the green sub-pixel 13, and the blue sub-pixel 15 with a same shape are orderly alternately aligned along a horizontal direction.

BRIEF DESCRIPTION OF THE FIGURES

Implementations of the present technology will now be described, by way of example only, with reference to the attached figures.

DETAILED DESCRIPTION

Figure 1:
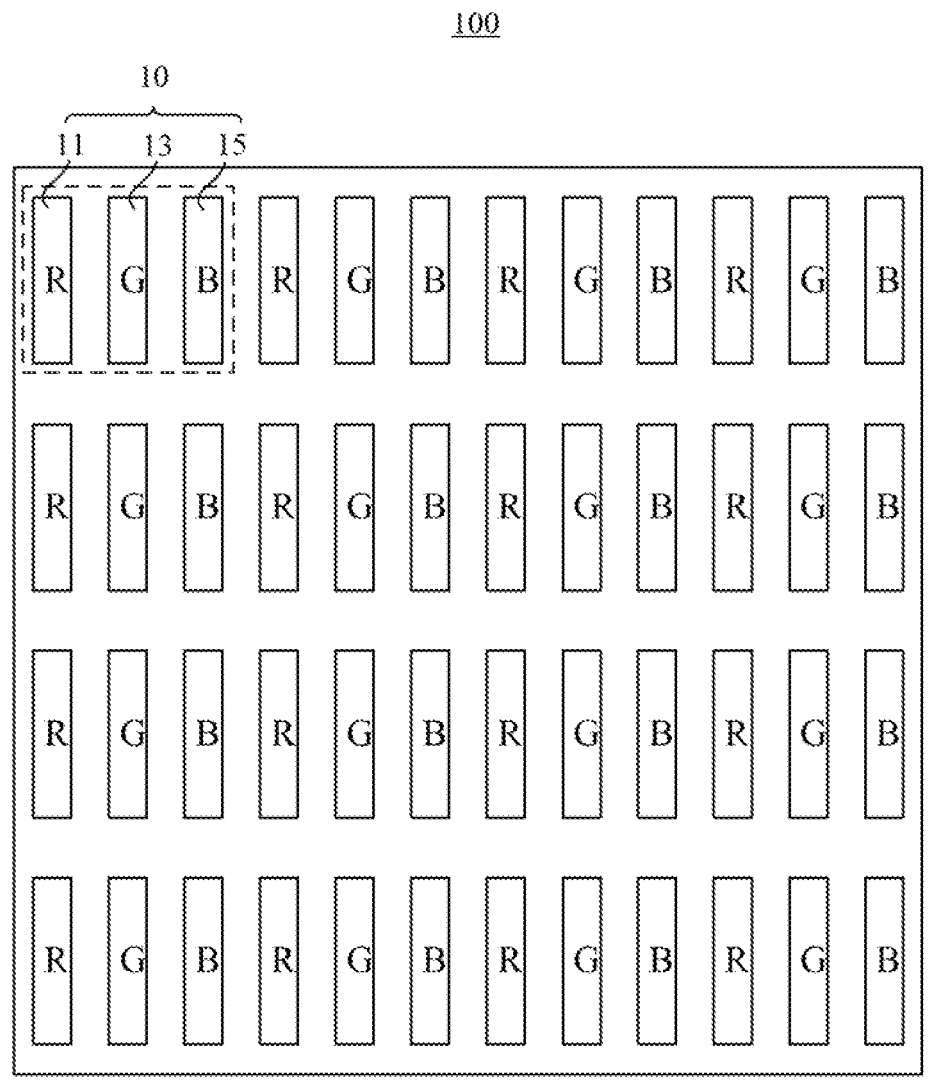
FIG. 1 is a diagrammatic view of an embodiment of a pixel structure in a related art.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to a pixel structure that can be easily assembled.

Figure 2:
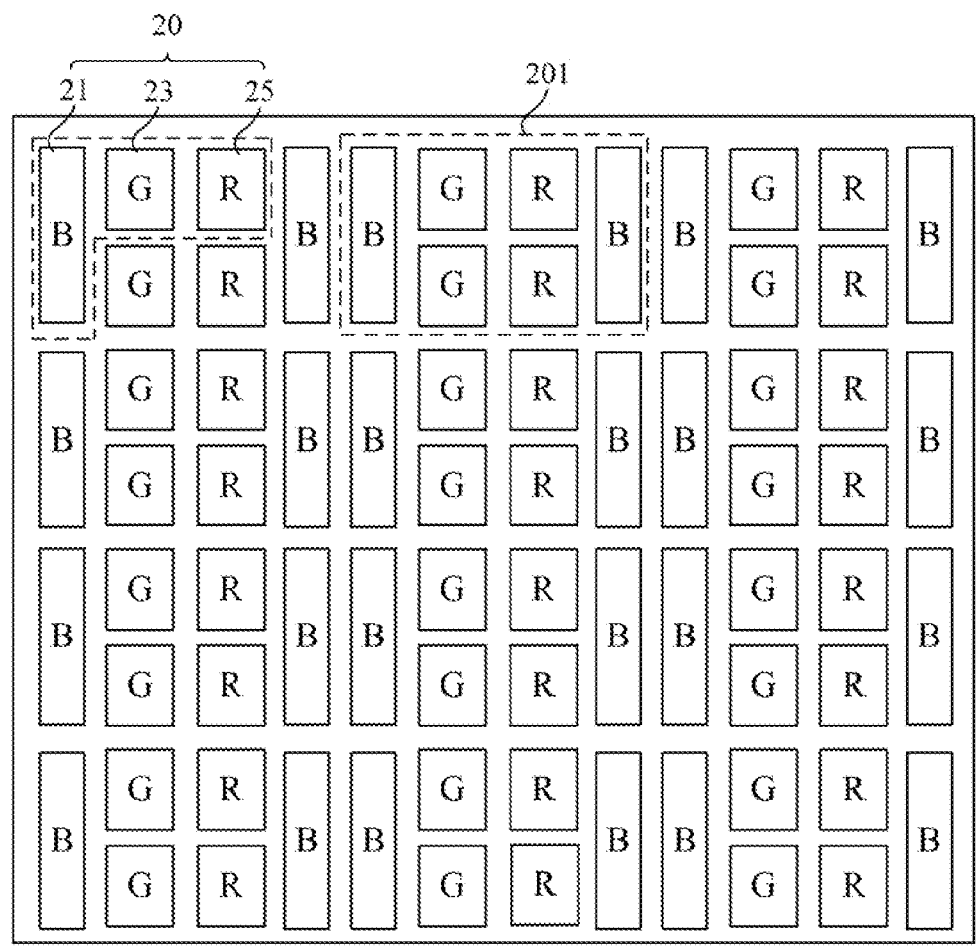
FIG. 2 is a diagrammatic view of a first embodiment of a pixel structure, the pixel structure comprising a first sub-pixel, a second sub-pixel, and a third sub-pixel.

FIG. 2 illustrates an embodiment of a pixel structure 200. The pixel structure 200 includes a plurality of pixels 20. The pixel 20 is substantially "L" shaped. In at least one embodiment, the pixel structure 200 is used in an organic light emitting diode display panel.

Each pixel 20 includes a first sub-pixel 21, a second sub-pixel 23, and a third sub-pixel 25. The first sub-pixel 21, the second sub-pixel 23, and the third sub-pixel 25 are spaced from each other. Each of the first sub-pixel 21, the second sub-pixel 23, and the third sub-pixel 25 is substantially a rectangular shape. In at least one embodiment, the pixel 20 further includes at least one driving element (not shown), a pixel electrode (not shown), an anode (not shown), a cathode (not shown), and an organic light emitting layer (not shown). An area of the organic light emitting layer corresponding to the first sub-pixel 21, the second sub-pixel 23, and the third sub-pixel 25 is greater than an area of the corresponding sub-pixel. In other embodiments, two adjacent organic light emitting layers corresponding to different sub-pixel are connected with each other.

Lengths of the first sub-pixel 21, the second sub-pixel 23, and the third sub-pixel 25 run parallel with each other along a first direction. Widths of the first sub-pixel 21, the second sub-pixel 23, and the third sub-pixel 25 run parallel with each other along a second direction. The length of the first sub-pixel 21 is greater than the length of the second sub-pixel 23 or the length of the third sub-pixel 25, and the length of the second sub-pixel 23 is equal to the length of the third sub-pixel 25. The width of the second sub-pixel 23 is equal to the width of the third sub-pixel 25, and the width of the second sub-pixel 23 is greater than the width of the first sub-pixel 21. In at least one embodiment, using 441 pixels per inch (PPI), the length of the first sub-pixel 21 is 37.7 μm, and the length of the second sub-pixel 23 is 15.8 μm. The width of the first sub-pixel 21 is 16.2 μm the width of the first sub-pixel 21 is 32.4 μm. The first sub-pixel 21 is a blue sub-pixel, the second sub-pixel 23 is a green sub-pixel, and the third sub-pixel 25 is a red sub-pixel.

The pixel 20 with a forward direction and the pixel 20 with an inverted direction are staggered with each other to form a pixel combination 201. The pixel combinations 201 are arranged in a matrix. The pixel 20 with the forward direction and the pixel 20 with the inverted direction are symmetrically located. The second sub-pixels 23 in the same pixel combination 201 are aligned in a first line along the second direction, and the third sub-pixels 25 in the same pixel combination 201 are aligned in a second line along the second direction, which is parallel with the first line. The first line and the second line are perpendicular to the first sub pixel 21 in the same pixel combination 201. The first sub-pixels 21 of the pixels 20 with the forward direction in the pixel combinations 201 are arranged along the first direction and are aligned in a column. The first sub-pixel 21 of the pixel combination 201 is adjacent to the first sub-pixel 21 of the adjacent pixel combination 201 along the second direction. The second sub-pixels 23 in the pixel combinations 201 are arranged along the first direction and are aligned in a column. The third sub-pixels 25 in the pixel combinations 201 are arranged along the first direction and are aligned in a column.

Based on the pixel structure 200, two adjacent sub-pixels are simultaneously disposed at intervals along the first direction and the second direction. A length of the first sub-pixel 21 is greater than the length of the second sub-pixel 23 and the third sub-pixel 25. With a same area of the pixel 20, the width of the second sub-pixel 23 and the third sub-pixel 25 are extended. Thus, a fabricating of the pixel structure 200 with a same resolution is improved.

Figure 3:
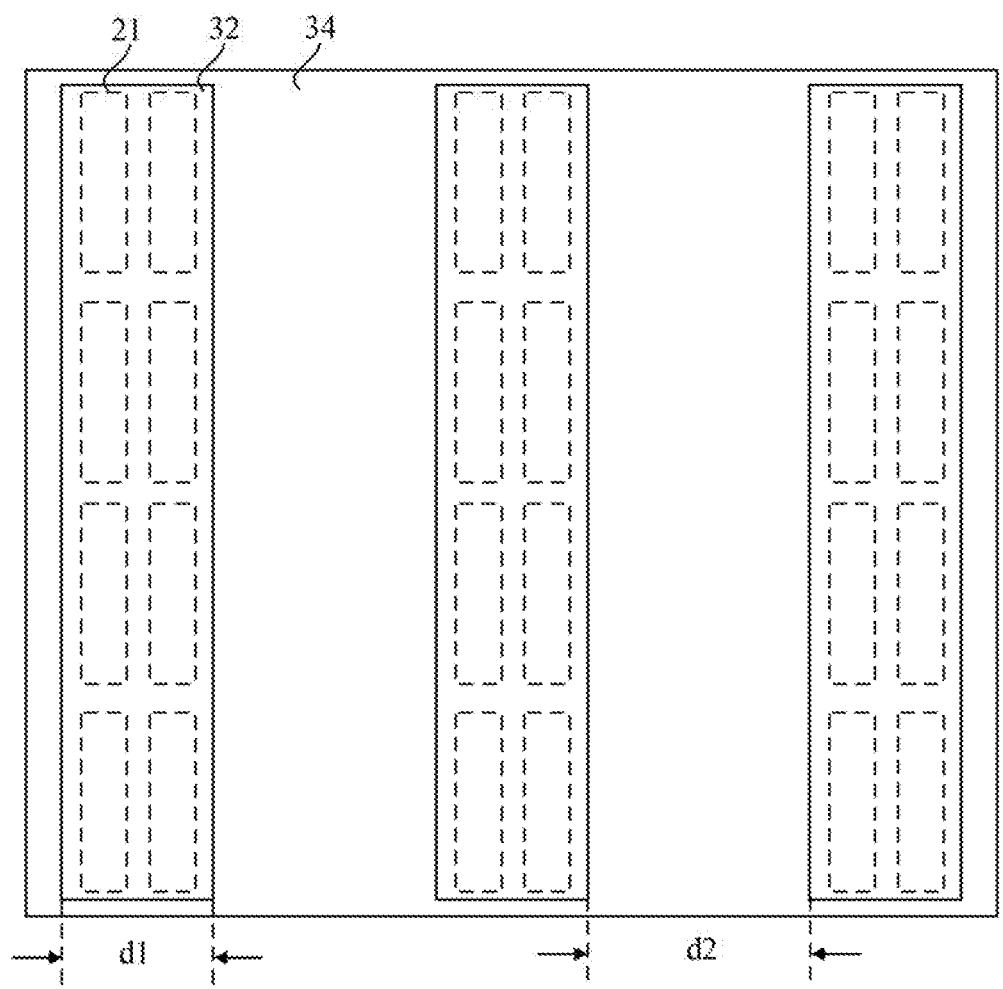
FIG. 3 is a diagrammatic view of an embodiment of a first mask corresponding to the first sub-pixel of FIG. 2.

FIG. 3 illustrates a first mask 300 for fabricating the organic light emitting layer of the first sub-pixel 21. The first mask 300 includes a first substrate 30. The first substrate 30 includes a plurality of first metal portions 34 and defines a plurality of first slits 32. The first substrate 30 further includes a plurality of first metal portions 34 located between the adjacent first slits 32. Each of the first slits 32 simultaneously forms a plurality of the organic light emitting layers, which are corresponding to the first sub-pixels 21 in two adjacent columns along the first direction. A width d1 of the first slit 32 is 38.4 μm, and a distance d2 between the two adjacent first slits 32 along the second direction is 76.8 μm.

Based on the first mask 300, the width d1 of the first slit 32 is extended, thus a fabricating method is improved, and a color mixture while fabricating the pixel structure 100 is avoided.

Figure 4:
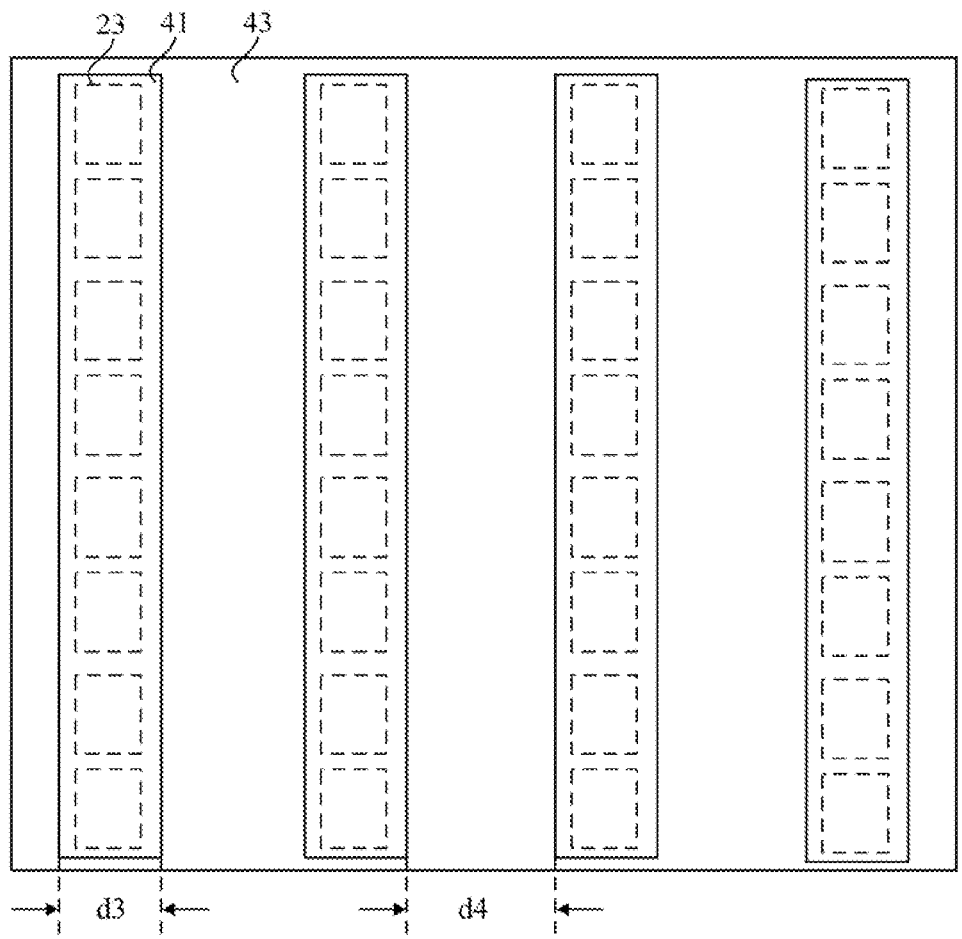
FIG. 4 is a diagrammatic view of an embodiment of a second mask corresponding to the second sub-pixel of FIG. 2.

FIG. 4 illustrates a second mask 400 for fabricating the organic light emitting layer of the second sub-pixel 23. The second mask 400 includes a second substrate 40. The second substrate 40 defines a plurality of second slits 41. The second substrate 40 further includes a plurality of second metal portions 43. Each second slit 41 is located between the adjacent second metal portions 43. Each second slit 41 corresponds to an organic light emitting layer, which is corresponding to the second sub-pixel 23 arranged in a column along the first direction. A width d3 of the second slit 41 is 38.4 μm, and a distance d4 between the two adjacent second slits 41 along the second direction is 76.8 μm.

The third sub-pixel 25 is fabricated by a mask with a same structure of the second mask 400.

Figure 5:
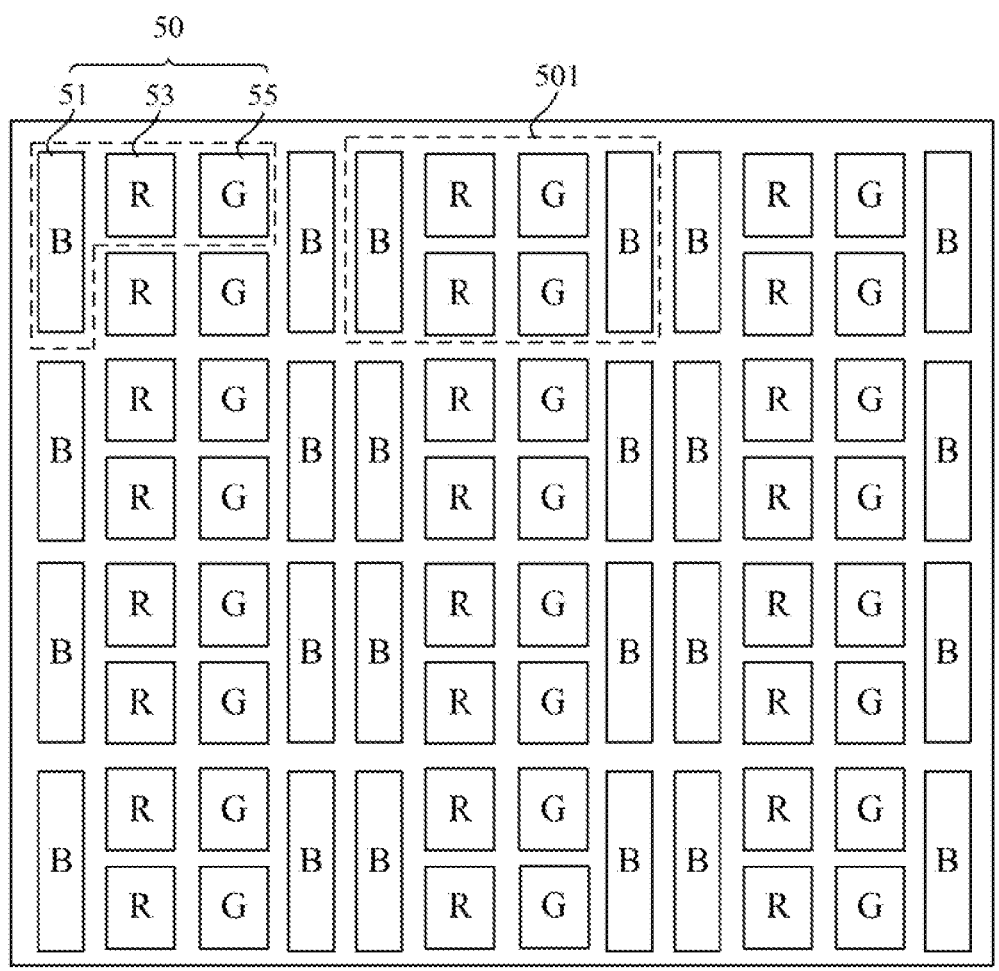
FIG. 5 is a diagrammatic view of a second embodiment of the pixel structure.

FIG. 5 illustrates a second embodiment of the pixel structure 500. The pixel structure 500 includes a plurality of pixels 50. The pixel 50 is substantially "L" shaped. In at least one embodiment, the pixel structure 500 is used in an organic light emitting diode display panel.

Each pixel 50 includes a first sub-pixel 51, a second sub-pixel 53, and a third sub-pixel 55. The first sub-pixel 51, the second sub-pixel 53, and the third sub-pixel 55 are spaced from each other. Each of the first sub-pixel 51, the second sub-pixel 53, and the third sub-pixel 55 is substantially a rectangular shape. In at least one embodiment, the pixel 50 further includes at least one driving element (not shown), a pixel electrode (not shown), an anode (not shown), a cathode (not shown), and an organic light emitting layer (not shown). An area of the organic light emitting layer corresponding to the first sub-pixel 51, the second sub-pixel 53, or the third sub-pixel 55 is greater than an area of the corresponding sub-pixel. In other embodiments, two adjacent organic light emitting layers corresponding to different sub-pixels are connected with each other.

Lengths of the first sub-pixel 51, the second sub-pixel 53, and the third sub-pixel 55 are parallel with each other along a first direction. Widths of the first sub-pixel 51, the second sub-pixel 53, and the third sub-pixel 55 are parallel with each other along a second direction. The length of the first sub-pixel 51 is greater than the length of the second sub-pixel 53 or the length of the third sub-pixel 55, and the length of the second sub-pixel 53 is equal to the length of the third sub-pixel 55. The width of the second sub-pixel 53 is equal to the width of the third sub-pixel 55, and the width of the second sub-pixel 53 is greater than the width of the first sub-pixel 51. In at least one embodiment, using 441 pixels per inch (PPI), the length of the first sub-pixel 51 is 37.7 μm, and the length of the second sub-pixel 53 is 15.8 μm. The width of the first sub-pixel 51 is 16.2 μm the width of the first sub-pixel 51 is 32.4 μm. The first sub-pixel 51 is a blue sub-pixel, the second sub-pixel 53 is a red sub-pixel, and the third sub-pixel 55 is a green sub-pixel.

A pixel 50 with a forward direction and a pixel 50 with an inverted direction are staggered with each other to form a pixel combination 501. The pixel combinations 501 are arranged in a matrix. The pixel 50 with the forward direction and the pixel 50 with the inverted direction are symmetrically located. The second sub-pixels 53 are aligned in a first line along the second direction, and the third sub-pixels 55 are aligned in a second line along the second direction, which is parallel with the first line. The first line and the second line are perpendicular to the first sub pixel 51. The first sub-pixels 51 of the pixels 50 with the forward direction in the pixel combinations 501 are arranged along the first direction and are aligned in a column. The first sub-pixel 51 of the pixel combination 501 is adjacent to the first sub-pixel 51 of the adjacent pixel combination 501 along the second direction. The second sub-pixels 53 in the pixel combinations 501 are arranged along the first direction and are aligned in columns. The third sub-pixels 55 in the pixel combinations 501 are arranged along the first direction and are aligned in a column.

Based on the pixel structure 500, two adjacent sub-pixels are simultaneously disposed at intervals along the first direction and the second direction. A length of the first sub-pixel 51 is greater than the length of the second sub-pixel 53 or the third sub-pixel 55. With a same area of the pixel 50, the width of the second sub-pixel 53 and the third sub-pixel 55 are extended. Thus, fabricating pixel structures 500 with a same resolution can be improved.

Figure 6:
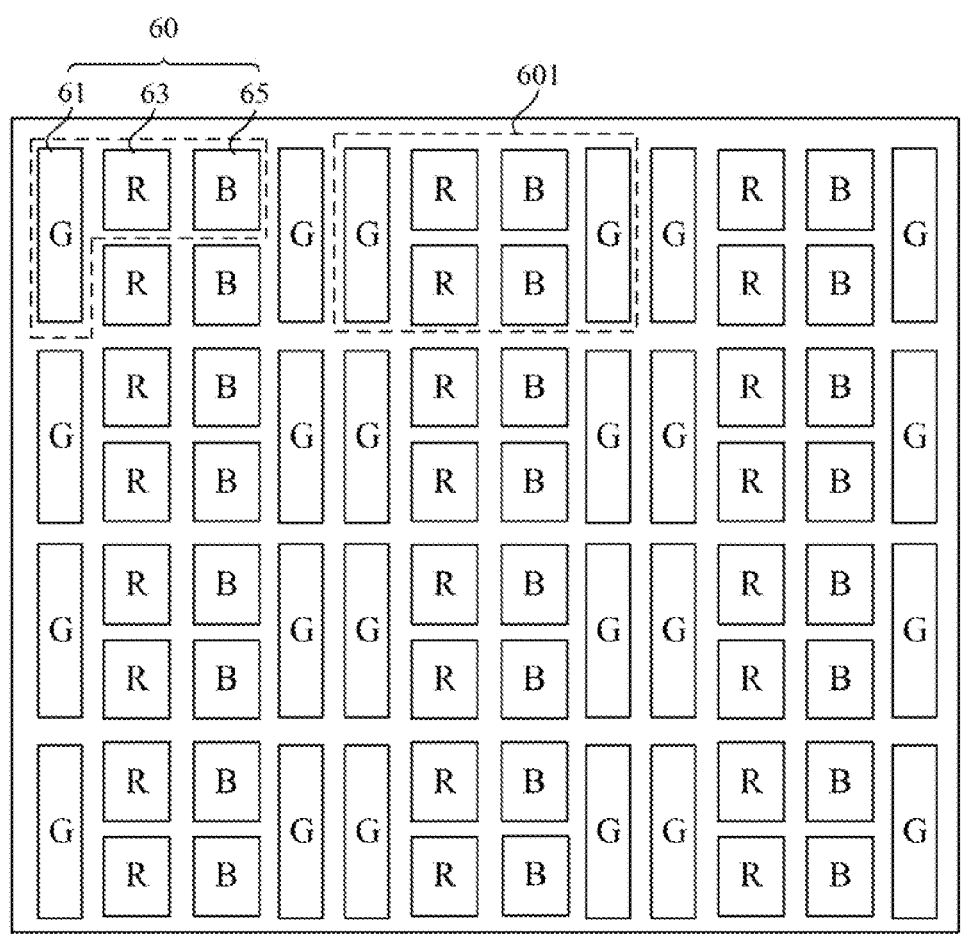
FIG. 6 is a diagrammatic view of a third embodiment of the pixel structure.

FIG. 6 illustrates a third embodiment of the pixel structure 600. The pixel structure 600 includes a plurality of pixels 60. The pixel 60 is substantially "L" shaped. In at least one embodiment, the pixel structure 600 is used in an organic light emitting diode display panel.

Each pixel 60 includes a first sub-pixel 61, a second sub-pixel 63, and a third sub-pixel 65. The first sub-pixel 61, the second sub-pixel 63, and the third sub-pixel 65 are spaced from each other. Each of the first sub-pixel 61, the second sub-pixel 63, and the third sub-pixel 65 is substantially a rectangular shape. In at least one embodiment, the pixel 60 further includes at least one driving element (not shown), a pixel electrode (not shown), an anode (not shown), a cathode (not shown), and an organic light emitting layer (not shown). An area of the organic light emitting layer corresponding to the first sub-pixel 61, the second sub-pixel 63, or the third sub-pixel 65 is greater than an area of the corresponding sub-pixel. In other embodiments, two adjacent organic light emitting layers corresponding to different sub-pixels are connected with each other.

Lengths of the first sub-pixel 61, the second sub-pixel 63, and the third sub-pixel 65 are parallel with each other along a first direction. Widths of the first sub-pixel 61, the second sub-pixel 63, and the third sub-pixel 65 are parallel with each other along a second direction. The length of the first sub-pixel 61 is greater than the length of the second sub-pixel 63 or the length of the third sub-pixel 65, and the length of the second sub-pixel 63 is equal to the length of the third sub-pixel 65. The width of the second sub-pixel 63 is equal to the width of the third sub-pixel 65, and the width of the second sub-pixel 63 is greater than the width of the first sub-pixel 61. In at least one embodiment, using 441 pixels per inch (PPI), the length of the first sub-pixel 61 is 37.7 µm, and the length of the second sub-pixel 63 is 15.8 µm. The width of the first sub-pixel 61 is 16.2 µm the width of the first sub-pixel 61 is 32.4 µm. The first sub-pixel 61 is a blue sub-pixel, the second sub-pixel 63 is a red sub-pixel, and the third sub-pixel 65 is a green sub-pixel.

A pixel 60 with a forward direction and a pixel 60 with an inverted direction are staggered with each other to form a pixel combination 601. The pixel combinations 601 are arranged in a matrix. The pixel 60 with the forward direction and the pixel 60 with the inverted direction are symmetrically located. The second sub-pixels 63 are aligned in a first line along the second direction, and the third sub-pixels 65 are aligned in a second line along the second direction, which is parallel with the first line. The first line and the second line are perpendicular to the first sub pixel 61. The first sub-pixels 61 of the pixels 60 with the forward direction in the pixel combinations 601 are arranged along the first direction and are aligned in a column. The first sub-pixel 61 of the pixel combination 601 is adjacent to the first sub-pixel 61 of the adjacent pixel combination 601 along the second direction. The second sub-pixels 63 in the pixel combinations 601 are arranged along the first direction and are aligned in a column. The third sub-pixels 65 in the pixel combinations 601 are arranged along the first direction and are aligned in a column.

Based on the pixel structure 600, two adjacent sub-pixels are simultaneously disposed at intervals along the first direction and the second direction. A length of the first sub-pixel 61 is greater than the length of the second sub-pixel 63 or the third sub-pixel 65. With a same area of the pixel 60, the width of the second sub-pixel 63 and the third sub-pixel 65 are extended. Thus, fabricating pixel structures 600 with a same resolution can be improved.

Figure 7:
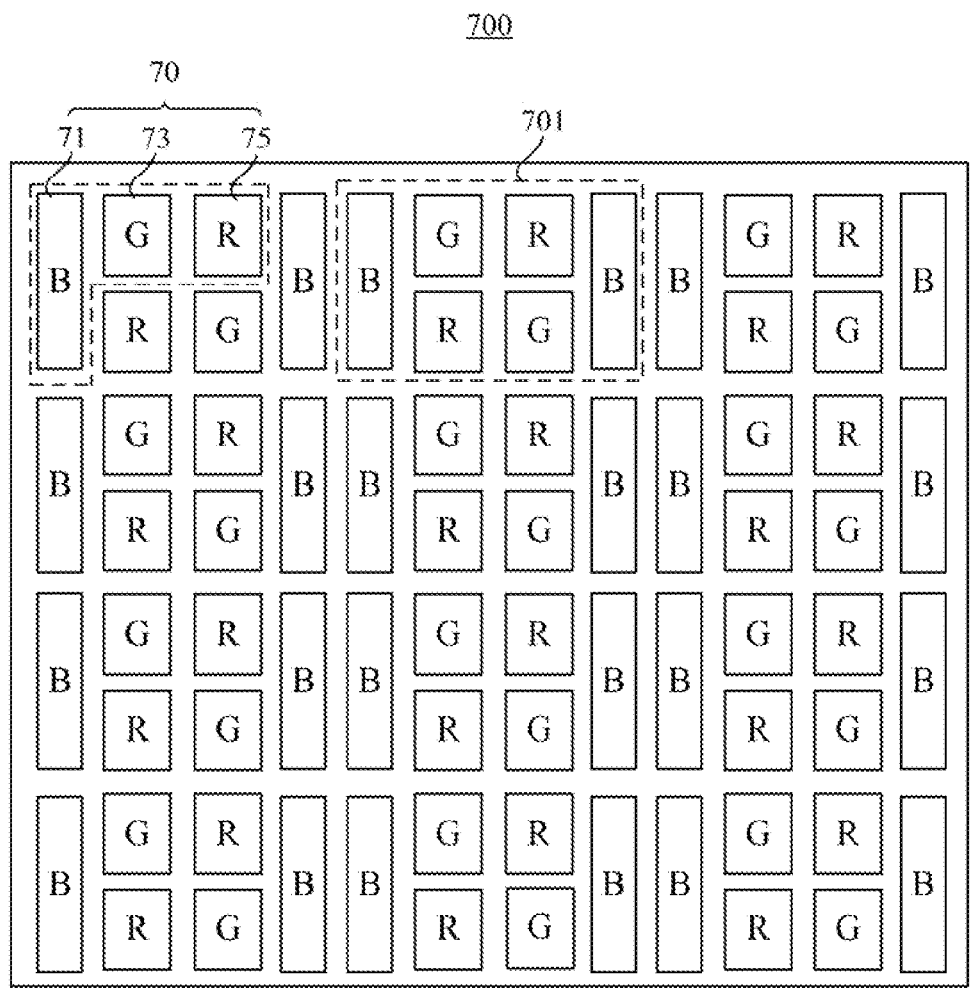
FIG. 7 is a diagrammatic view of a fourth embodiment of the pixel structure.

FIG. 7 illustrates a fourth embodiment of the pixel structure 700. The pixel structure 700 includes a plurality of pixels 70. The pixel 70 is substantially "L" shaped. In at least one embodiment, the pixel structure 700 is used in an organic light emitting diode display panel.

Each pixel 70 includes a first sub-pixel 71, a second sub-pixel 73, and a third sub-pixel 75. The first sub-pixel 71, the second sub-pixel 73, and the third sub-pixel 75 are spaced from each other. Each of the first sub-pixel 71, the second sub-pixel 73, and the third sub-pixel 75 is substantially a rectangular shape. In at least one embodiment, the pixel 70 further includes at least one driving element (not shown), a pixel electrode (not shown), an anode (not shown), a cathode (not shown), and an organic light emitting layer (not shown). An area of the organic light emitting layer corresponding to the first sub-pixel 71, the second sub-pixel 73, or the third sub-pixel 75 is greater than an area of the corresponding sub-pixel. In other embodiments, two adjacent organic light emitting layers corresponding to different sub-pixels are connected with each other.

Lengths of the first sub-pixel 71, the second sub-pixel 73, and the third sub-pixel 75 are parallel with each other along a first direction. Widths of the first sub-pixel 71, the second sub-pixel 73, and the third sub-pixel 75 are parallel with each other along a second direction. The length of the first sub-pixel 71 is greater than the length of the second sub-pixel 73 or the length of the third sub-pixel 75, and the length of the second sub-pixel 73 is equal to the length of the third sub-pixel 75. The width of the second sub-pixel 73 is equal to the width of the third sub-pixel 75, and the width of the second sub-pixel 73 is greater than the width of the first sub-pixel 71. In at least one embodiment, using 441 pixels per inch (PPI), the length of the first sub-pixel 71 is 37.7 µm, and the length of the second sub-pixel 73 is 15.8 µm. The width of the first sub-pixel 71 is 16.2 µm the width of the first sub-pixel 71 is 32.4 µm. The first sub-pixel 71 is a blue sub-pixel, the second sub-pixel 73 is a red sub-pixel, and the third sub-pixel 75 is a green sub-pixel.

A pixel 70 with a forward direction and a pixel 70 with an inverted direction are staggered with each other to form a pixel combination 701. The pixel combinations 701 are arranged in a matrix. The pixel 70 with the forward direction and the pixel 70 with the inverted direction are symmetrically located. In a pixel combination 701, the second sub-pixel 73 of the pixel 70 with the forward direction and the third sub-pixel 75 of the pixel 70 with the inverted direction are aligned in a first line, and the third sub-pixel 75 of the pixel 70 with the forward direction and the second sub-pixel 73 of the pixel 70 with the inverted direction are aligned in a second line. The first line and the second line are perpendicular to the first sub pixel 71. The first sub-pixels 71 of the pixels 70 with the forward direction in the pixel combinations 701 are arranged along the first direction and are aligned in a column. The first sub-pixel 71 of the pixel combination 701 is adjacent to the first sub-pixel 71 of the adjacent pixel combination 701 along the second direction.

Based on the pixel structure 700, two adjacent sub-pixels are simultaneously disposed at intervals along the first direction and the second direction. A length of the first sub-pixel 71 is greater than the length of the second sub-pixel 73 or the third sub-pixel 75. With a same area of the pixel 70, the width of the second sub-pixel 73 and the third sub-pixel 75 are extended. Thus, fabricating pixel structures 700 with a same resolution can be improved.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:
1. A pixel structure comprising:
  a plurality of pixel combinations in a matrix; each of the pixel combinations comprises a first pixel with a forward direction and a second pixel with an inverted direction, each of the first pixel and the second pixel comprising:
    a first sub-pixel;
    a second sub-pixel; and
    a third sub-pixel;
  wherein lengths of the first sub-pixel, the second sub-pixel, and the third sub-pixel are arranged along a first direction, and widths of the first sub-pixel, the second sub-pixel, and the third sub-pixel is arranged along a second direction;
  a length of the first sub-pixel is greater than a length of the second sub-pixel along the first direction and a length of the third sub-pixel along the first direction; and
  the first sub-pixel, the second sub-pixel, and the third sub-pixel are orderly arranged along the second direction;

wherein the first pixel and the second pixel are staggered with each other; in one pixel combination, the two second sub-pixel and the two third sub-pixel are sandwiched between the two first sub-pixel.

2. The pixel structure of claim 1, wherein the two first sub-pixels in the same pixel combination are aligned in a column along the first direction.

3. The pixel structure of claim 2, wherein the two adjacent first sub-pixels in two adjacent pixel combinations along the first direction are simultaneously formed via a first slit defined on a first mask along the first direction.

4. The pixel structure of claim 3, wherein a width of the first slit is 38.4 µm.

5. The pixel structure of claim 1, wherein the two second sub-pixels in the pixel combination are aligned in a first line along the second direction, and the two third sub-pixels in the pixel combination are aligned in a second line along the second direction which is parallel with the first line; the first line and the second line are perpendicular to the two first sub pixels parallel with each other.

6. The pixel structure of claim 5, wherein the two second sub-pixels in the same pixel combination are simultaneously formed via a second slit defined on a second mask along the first direction.

7. The pixel structure of claim 1, wherein the second sub-pixel of the first pixel with the forward direction and the third sub-pixel of the first pixel with the forward direction in the same pixel combination are aligned in a first line, and the third sub-pixel of the first pixel with the forward direction and the second sub-pixel of the second pixel with the inverted direction in the same pixel combination are aligned in a second line which is perpendicular to the first line.

8. The pixel structure of claim 7, wherein the second sub-pixel of the first pixel and the third sub-pixel of the second pixel in the same pixel combination arranged in a column along the first direction are simultaneously formed via a second slit defined on a second mask along the first direction.

9. The pixel structure of claim 8, wherein a width of the second slit is 38.4 µm.

10. The pixel structure of claim 1, wherein the pixel is substantially "L" shaped.

11. The pixel structure of claim 1, wherein the length of the first sub-pixel is greater than the length of the second sub-pixel and the length of the third sub-pixel, and the length of the second sub-pixel is equal to the length of the third sub-pixel; the width of the second sub-pixel is equal to the width of the third sub-pixel, and the width of the second sub-pixel is greater than the width of the first sub-pixel.

12. The pixel structure of claim 11, wherein the length of the first sub-pixel is 37.7 µm, and the length of the second sub-pixel is 15.8 µm; the width of the first sub-pixel is 16.2 µm the width of the first sub-pixel is 32.4 µm.

13. The pixel structure of claim 1, wherein the first sub-pixel is a blue sub-pixel, the second sub-pixel is a green sub-pixel, and the third sub-pixel is a red sub-pixel.

14. The pixel structure of claim 1, wherein the first sub-pixel is a blue sub-pixel, the second sub-pixel is a red sub-pixel, and the third sub-pixel is a green sub-pixel.

15. The pixel structure of claim 1, wherein the first sub-pixel is a blue sub-pixel, the second sub-pixel is a green sub-pixel, and the third sub-pixel is a red sub-pixel.

16. The pixel structure of claim 1, wherein the first sub-pixel is a green sub-pixel, the second sub-pixel is a red sub-pixel, and the third sub-pixel is a blue sub-pixel.

* * * * *